(12) United States Patent
Vincent et al.

(10) Patent No.: US 10,834,817 B2
(45) Date of Patent: Nov. 10, 2020

(54) PLATED OPENING WITH VENT PATH

(71) Applicant: NXP USA, INC., Austin, TX (US)

(72) Inventors: Michael B. Vincent, Austin, TX (US); Zhiwei Gong, Austin, TX (US); Scott M. Hayes, Austin, TX (US)

(73) Assignee: NXP USA, INC., Austin, TX (US)

( * ) Notice: Subject to any disclaimer, the term of this patent is extended or adjusted under 35 U.S.C. 154(b) by 266 days.

(21) Appl. No.: 16/167,814

(22) Filed: Oct. 23, 2018

(65) Prior Publication Data
US 2019/0059157 A1 Feb. 21, 2019

Related U.S. Application Data

(62) Division of application No. 15/380,054, filed on Dec. 15, 2016, now Pat. No. 10,143,084.

(51) Int. Cl.
| H05K 13/04 | (2006.01) |
| H05K 1/11 | (2006.01) |
| H05K 3/42 | (2006.01) |
| H05K 3/00 | (2006.01) |
| H05K 3/28 | (2006.01) |
| H05K 3/34 | (2006.01) |
| H05K 1/18 | (2006.01) |
| H01L 21/48 | (2006.01) |
| H01L 23/498 | (2006.01) |
| H01L 21/56 | (2006.01) |
| H01L 23/31 | (2006.01) |
| H05K 1/14 | (2006.01) |

(52) U.S. Cl.
CPC ............ *H05K 1/115* (2013.01); *H01L 21/486* (2013.01); *H01L 21/56* (2013.01); *H01L 23/3121* (2013.01); *H01L 23/49827* (2013.01); *H01L 23/49838* (2013.01); *H05K 1/181* (2013.01); *H05K 3/0026* (2013.01); *H05K 3/0047* (2013.01); *H05K 3/284* (2013.01); *H05K 3/341* (2013.01); *H05K 3/42* (2013.01); *H05K 1/145* (2013.01); *H05K 3/3436* (2013.01); *H05K 2201/09509* (2013.01); *H05K 2201/09545* (2013.01); *H05K 2201/09645* (2013.01); *H05K 2201/10378* (2013.01); *H05K 2201/10977* (2013.01); *H05K 2203/1178* (2013.01); *H05K 2203/1316* (2013.01); *H05K 2203/1327* (2013.01); *Y10T 29/49165* (2015.01); *Y10T 29/5313* (2015.01)

(58) Field of Classification Search
USPC ......... 29/729, 738, 739, 740, 745, 825, 829, 29/832, 840, 846, 847, 852
See application file for complete search history.

(56) References Cited

U.S. PATENT DOCUMENTS

| 5,420,377 A | 5/1995 | Bresin et al. |
| 5,842,275 A | 12/1998 | McMillan, II et al. |
| 6,316,737 B1 | 11/2001 | Evans et al. |
| 6,580,174 B2 | 6/2003 | McCormick et al. |
| 6,787,443 B1 | 9/2004 | Boggs et al. |

(Continued)

Primary Examiner — Thiem D Phan
(74) Attorney, Agent, or Firm — David G. Dolezal

(57) ABSTRACT

A plated hole with a sidewall plating. The plated hole has a vent opening that has a sidewall of non-conductive material that is not plated. During attachment of a joint conductive material such as solder to the sidewall plating, gasses generated from the attachment process are outgassed through the vent opening.

9 Claims, 8 Drawing Sheets

(56) References Cited

U.S. PATENT DOCUMENTS

| | | | |
|---|---|---|---|
| 7,126,210 B2* | 10/2006 | Chiu | H01L 23/36 |
| | | | 257/667 |
| 7,425,507 B2* | 9/2008 | Lake | H01L 21/30655 |
| | | | 438/694 |
| 7,507,914 B2 | 3/2009 | Levine et al. | |
| 7,687,899 B1 | 3/2010 | Berry | |
| 2018/0177049 A1 | 6/2018 | Vincent et al. | |

\* cited by examiner

PLATED OPENING WITH VENT PATH

This application is a divisional application of a U.S. patent application entitled "PLATED OPENING WITH VENT PATH", having a serial number of Ser. No. 15/380,054, having a filing date of Dec. 15, 2016, having common inventors, and having a common assignee, all of which is incorporated by reference in its entirety.

BACKGROUND OF THE INVENTION

Field of the Invention

This invention relates in general plated openings for electronic component assemblies and more specifically to a plated opening with a vent path in an electronic component assembly.

Description of the Related Art

Electronic components and electronic component packages can be coupled to devices such as interposers, substrates, and circuit boards. Electrical coupling can be made by the use of plated openings in the interposer, substrate or circuit board.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

An electrical coupling can be made to a sidewall plating of an opening of a workpiece such as an interposer, circuit board, electronic component package, or substrate. The opening includes a vent path in non-conductive material of the workpiece for outgassing of gasses formed from the attachment process of conductive joint material to the sidewall plating. In one embodiment, the vent path includes an opening with an unplated sidewall in non-nonconductive material formed adjacent to a plated opening such that a portion of the sidewall plating is removed (or exposed in some embodiments) during the formation of the vent path. During electrical attachment, conductive joint material attaches to the sidewall plating to make electrical contact. The gases from the attachment process are vented out the vent path. In some embodiments, encapsulant may be formed in the vent path after a subsequent encapsulation.

With some embodiments, utilizing a plated opening with a vent path may enable a conductive structure to be electrically attached to a workpiece with a reduced spacing between the conductive structure and the workpiece. Also, because the conductive joint material can wet on the sides of the sidewall plating for attachment, a pad for the plated opening on the major surface of the workpiece may not be needed for the electrical coupling. Having the vent path that includes an unplated opening sidewall of non-conductive material may prevent in some embodiments, the conductive joint material from attaching to the unplated opening sidewall.

Figure 1:
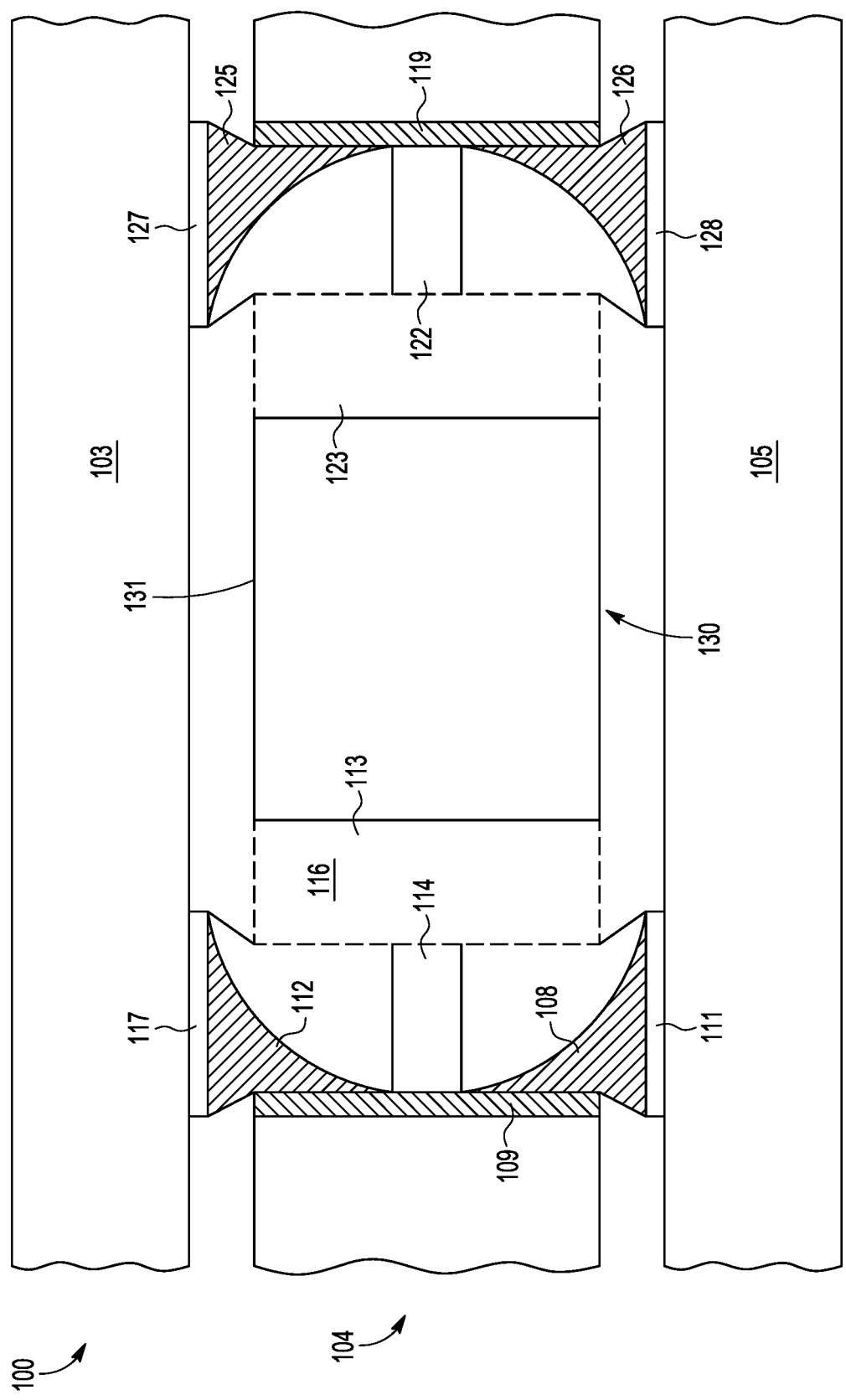
FIG. 1 is a partial cutaway side view of an electronic component assembly according to one embodiment of the present invention

FIG. 1 is a partial cutaway side view an electronic component assembly according to one embodiment. Assembly 100 includes a substrate 103 and a substrate 105 that include conductive structures coupled to each other though plated holes in interposer 104. In the embodiment shown, conductive pad 117 of substrate 103 is electrically coupled to conductive pad 111 of substrate 105 by solder joint 112 and solder joint 108 attached to sidewall plating 109. Sidewall plating 109 covers a portion of the sidewall of opening 114 and sidewall plating 119 covers of portion of the sidewall of opening 122. Solder joints 112 and 108 each include portions located in opening 114 for attaching to sidewall plating 109. Likewise, conductive pad 127 of substrate 103 is electrically coupled to conductive pad 128 of substrate 105 by solder joint 125 and solder joint 126 attached to sidewall plating 119 of opening 122. The solder of the joints do not attach to the sidewalls (116) of the vent openings 113 and 123 in that those sidewalls are not solder wettable surfaces.

In one embodiment, interposer 104 is predominately made of a non-conductive material such as a dielectric material (e.g. a resin) or a semiconductive material (e.g. silicon), wherein openings are made in the non-conductive material. In the embodiment shown, the sidewalls (116) of the openings (113) are of the non-conductive material.

Each opening 114 and 122 is continuous with a vent opening (113 and 123, respectively) such that each opening and vent opening form a larger opening so that gasses formed during a solder reflow process can escape from interposer 104 through the vent opening. If vent openings 113 and 123 did not exist, then gasses generated during a reflow process could be trapped in a plated opening and potentially cause a failure or other defect of a sidewall plating/solder joint/conductive structure attachment.

In one embodiment, assembly 100 includes electronic components (not shown) attached to substrates 103 and 105. Examples of electronic components include semiconductor die such as microprocessors, MEMS devices, standalone memories and other electronic components such as capacitors, resistors, power transistors, and inductors. The electronic components may be packaged or unpackaged. In other embodiments, a packaged or unpackaged electronic component may include conductive structures (e.g. pads, bumps, posts) that are electrically coupled to sidewall platings (109) with solder joints (112). In still other embodiments, interposer 104 may be replaced with another type of workpiece such as a circuit board, substrate, or packaged electronic component that includes plated openings with vent openings. In some embodiments, a die may be located in the position of substrate 103 and a printed circuit board may be located in the position of substrate 105. In other embodiment, a packaged electronic component may be located in the position of substrate 103 and a second packaged electronic component is located in the position of interposer 104 where the second packaged electronic component includes plated openings with vent openings (e.g. 113). In other embodiments, other types of conductive joint material such as electrically conductive adhesive may be used in place of the solder of joints 112, 108, 125 and 126 to electrically join a conductive structure (e.g. pad 117) to a sidewall plating (109).

In the embodiment shown, openings 114 and 122 and plated sidewalls 109 and 119 extend from one major surface 131 to opposing major surface 130 of interposer 104 such that the openings and plated sidewalls may be characterized as plated through hole vias or plated through holes.

Figure 2:
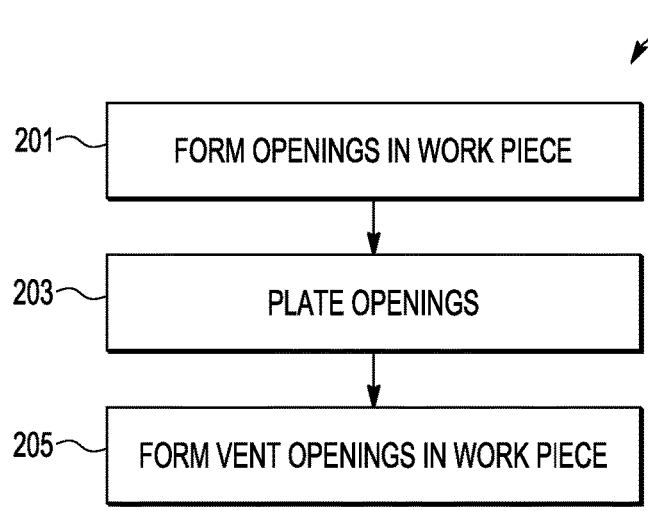
FIG. 2 is a flow chart showing a method for forming a plated opening in a workpiece according to one embodiment of the present invention.

FIG. 2 is a flow chart showing one embodiment for forming a plated opening with a vent hole in a workpiece. In operation 201, an opening is formed in a workpiece such as substrate, printed circuit board, packaged electronic component, or interposer. The opening is typically formed in non-conductive material of a workpiece such as dielectric material (e.g. FR-4, encapsulant, glass, PTFE, polyimides, pre-preg layers or a combination thereof), semiconductor material (e.g. silicon), or a combination thereof. A non-conductive material of a workpiece may include a structure of a homogeneous substance or multiple structures of different substances such as with a multilayer workpiece. The workpiece may include conductive structures (e.g. an embedded interconnect) such that the opening extends to or extends through in the workpiece. The opening can be formed by drilling with a drill bit, laser ablation, milling, a photolithographic process, or by chemical or dry etching. In some embodiments, the opening can extend from a first major surface to a second major surface of the workpiece or partially through the workpiece to a conductive structure (such as with a blind via). In one embodiment, the workpiece may have a thickness in the range of 150-600 microns, but may have other thicknesses in other embodiments.

In operation 203, the openings are plated with a conductive material (e.g. copper, gold, silver, tin, nickel, Pd) to form sidewall platings. The plating can be performed by a number of plating process such as electrolytic plating or electroless plating, or by a deposition process. In one embodiment, excess plated material is removed after the plating process (e.g. from the major surfaces of the workpiece in some embodiments). In other embodiments, a plate mask may be formed on specific portions of the workpiece prior to the plating process to prevent those specific portions from being plated. In one embodiment, the plating has a thickness in the range of 2-20 microns, but may be other thicknesses in other embodiments. In some embodiments, the sidewall plating may completely fill the opening.

In other embodiments, sidewall plating can be formed by forming an opening in a workpiece and filling the opening with an electrically conductive adhesive (ECA). A smaller opening is then formed in the ECA material to leave a portion of the ECA material on the sidewall. In some embodiments, the ECA is solder wettable. With some of these embodiments, the second opening can be offset from the first opening, where the second opening is partially made in the workpiece to form the vent path. In other embodiments, a third opening would be made to form the vent path.

In operation 205, openings are formed in the workpiece to form vent openings for the plated openings. The vent openings can be formed by drilling, laser ablation, milling, etching, or a photolithographic process. In some embodiments, vent openings are formed adjacent to each plated opening such that a portion of the sidewall plating of the plated opening is removed. In some embodiments, the effect of the formation of the vent openings is to widen the initial openings by removing material of the workpiece and to remove a portion of the sidewall plating. In some embodiments where the initial opening is completely filled with the conductive material by the plating process, the vent hole opening would be offset from the initial opening so as to remove material from the workpiece and from the conductive material filling the opening. In some embodiments, forming the vent hole opening exposes the sidewall plating but does not remove the sidewall plating or does not remove a significant portion of the sidewall plating.

In some embodiments, the workpiece can be singulated into multiple workpieces, each with multiple plated openings with vent openings. Also, plated openings with vent openings can be formed by other processes in other embodiments.

Figure 3A:
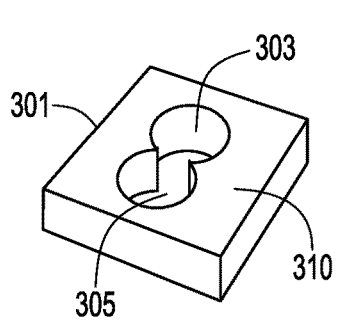
FIGS. 3A-3C show prospective views of a workpiece in three different stages in forming a plated opening according to one embodiment of the present invention.
Figure 3B:
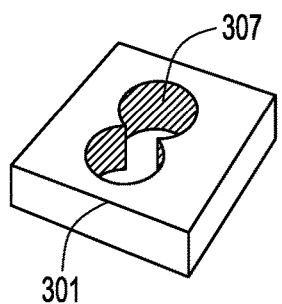
Figure 3C:
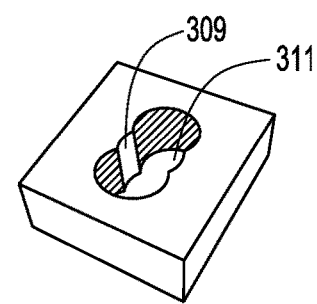

FIGS. 3A, 3B, and 3C show the results of operations 201, 203 and 205 respectively, according to one embodiment. FIG. 3A shows the results of operation 201 where openings 303 and 305 are formed in workpiece 301 of non-conductive material. In the embodiment shown workpiece 301 has a rectangle shape with two openings formed. However in other embodiments, a workpiece may include many more openings and include locations for other devices (e.g. electronic components), include other structures (including conductive structures), and be of other shapes and sizes. These additional features are not shown in FIGS. 3A-3C in order to more clearly illustrate the effects of operations 201, 203, and 205.

In one embodiment, openings 305 and 303 are formed by drilling from major surface 310 to the opposing major surface (not shown). In the embodiment shown, openings 303 and 305 overlap. In one embodiment, the openings have a diameter of 200 μm, with a center separation pitch of 0.15 mm, but these dimensions maybe different in different embodiments.

FIG. 3B shows workpiece 301 after plating operation 203 is performed to plate a conductive material 307 on the sidewalls of openings 303 and 305. FIG. 3C shows workpiece 301 after vent opening 311 is formed in workpiece 301. In the embodiment shown, opening 311 is formed by removing non-conductive material of the workpiece between openings 303 and 305. The formation of opening 311 removes non-conductive workpiece material and a portion of conductive plating 307 to form a portion 309 of the sidewall of the non-conductive material that is not plated. In one embodiment, opening 311 has the same size diameter as openings 303 and 305, but may be of a different size in other embodiments (e.g. either smaller or larger). In some embodiments, openings 303 and 305 may be filled with a sacrificial material (not shown) after the plating operation 203 so as to inhibit the drill bit from becoming offset during the drilling of opening 311. Afterwards, the sacrificial material is removed. In some embodiments, openings 303 and 305 may be formed by one process (e.g. drilling) and opening 311 may be formed by another process (e.g. laser ablation).

Figure 4A:
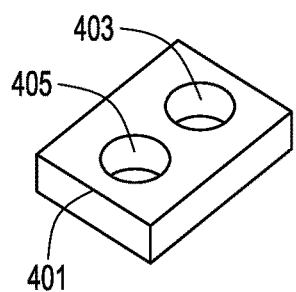
FIGS. 4A-4C show prospective views of a workpiece in three different stages in forming a plated opening according to one embodiment of the present invention.
Figure 4B:
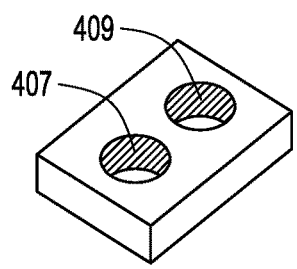
Figure 4C:
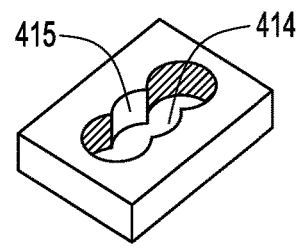

FIGS. 4A, 4B, and 4C show the results of operations 201, 203 and 205 respectively, according to another embodiment. With the embodiment of FIGS. 4A, 4B, and 4C, the openings 403 and 405 in workpiece 401 do not overlap as shown in FIG. 4A. In one embodiment, openings 405 and 403 have a diameter of 200 μm and a center separation pitch of 0.25 mm, but these may be of other values in other embodiments. In FIG. 4B, openings 405 and 403 are plated to form sidewall platings 407 and 409 respectively. In FIG. 4C, opening 414 is formed in workpiece 401 to form a vent opening for plated opening 405 and plated opening 403. The formation of opening 414 exposes sidewall portions 415 of non-conductive material of workpiece 401 which are not plated.

Figure 5A:
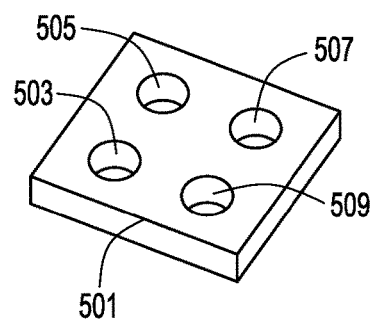
FIGS. 5A-5C show prospective views of a workpiece in three different stages in forming a plated opening according to one embodiment of the present invention.
Figure 5B:
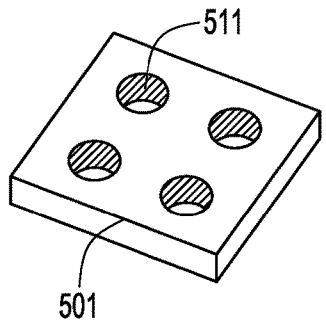
Figure 5C:
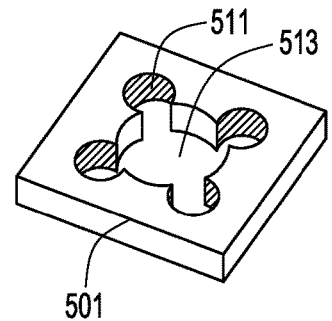

FIGS. 5A, 5B, and 5C show the results of operations 201, 203 and 205 respectively, according to another embodiment. In the embodiment of FIGS. 5A, 5B, and 5C, a one vent hole 513 (shown in FIG. 5C) is formed to provide a vent opening for plated openings 503, 505, 507 and 509. Figure A shows workpiece 501 after openings 503, 505, 507 and 509 are formed. FIG. 5B shows openings 503, 505, 507 and 509 after being plated with a sidewall plating (511). In one embodiment, vent hole opening 513 has a center located between the four openings 503, 505, 507 and 509 and has a diameter that removes plated material on the sidewalls of each of openings 503, 505, 507 and 509. In one embodiment where openings 503, 505, 507 and 509 have a diameter of 200 μm and have a center spacing pitch of 0.4 mm, opening 513 has a diameter of 420 μm. However, these values may be different in other embodiments.

In other embodiments, one vent opening may provide a vent path for a different number of plated openings. For example, an opening may provide a vent path for 1, 3, 5, or greater number of plated openings. In the embodiments of FIGS. 3C, 4C, and 5C, the vent openings extend all the way though the workpiece. However, in other embodiments, the vent openings may extend only through a portion of the workpiece.

Figure 6:
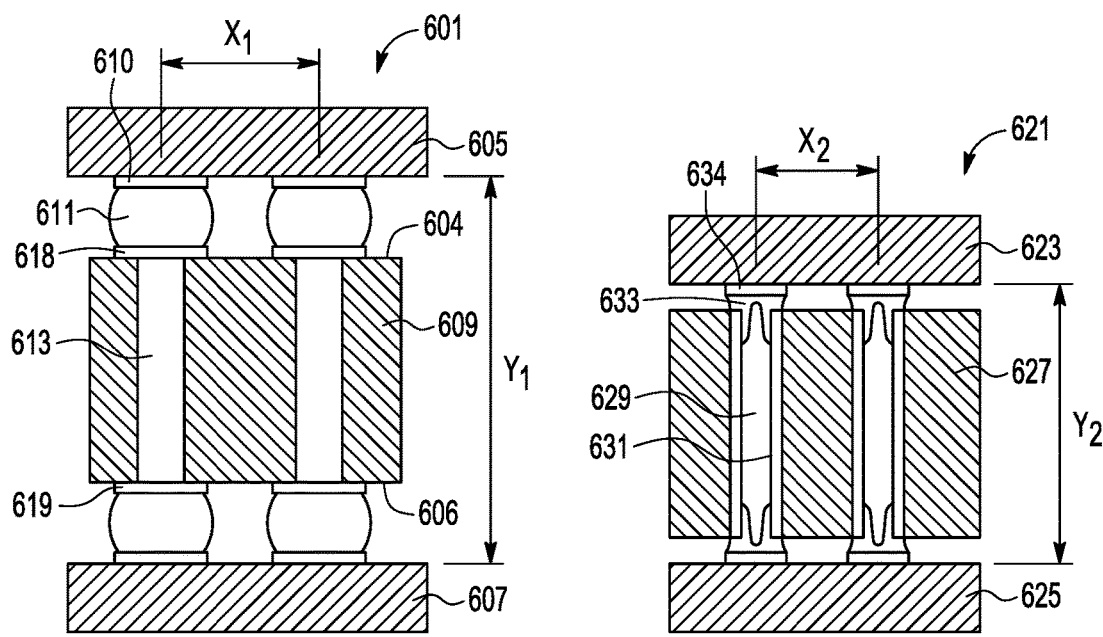
FIG. 6 shows cross sectional side views of a prior art electronic component assembly and an electronic component assembly according to one embodiment of the present invention.

FIG. 6 shows a cross sectional side by side comparison of a prior art electronic component assembly 601 and an electronic component assembly 621 according to the one embodiment of the present invention. Prior art assembly 601 includes a substrate 605, a substrate 607, and an interposer 609 located in between. Interposer 609 includes filled vias (613). Each filled via (613) includes a plate (618) located on major surface 604 of interposer 609 and a plate (619) located on major surface 606 of interposer 609. Each pad (610) of a substrate is electrically attached to a plate (618) of a filled via (613) with a solder ball (611). The filled vias can be filled with conductive material or nonconductive material (e.g. polymer).

Assembly 621 (shown) as a cross sectional view in FIG. 6 includes substrates 623 and 625 and interposer 627, which are the same size as substrates 605 and 607 and interposer 609 of assembly 601 respectively. Interposer 627 includes plated openings (629) with a sidewall plating (631). Each plated opening (629) of interposer 627 includes a vent opening (not shown in the cross sectional view of FIG. 6 that allows gasses to escape during a reflow process in the formation of the solder joints (633) for electrically coupling the sidewall plating (631) to a conductive structure (634) of the substrates (623). In the view of FIG. 6, the vent opening can be in front of, behind, or at a diagonal to the cross section shown in FIG. 6.

Because the solder joints (633) of assembly 621 are attached to the sidewall plating (631) in opening 629, the surface area of attachment to the plated opening can be the same as for a solder ball (611) being attached to a major surface plate (618) of a filled via (613) of assembly 601. Accordingly, the top plate of a plated via can be omitted with assembly 621. Without the top plate, the plated openings of assembly 621 can be located closer together than the filled vias of assembly 601. See FIG. 6 where $X_2 < X_1$. Thus, by providing vent openings which allows for solder or other conductive joint material to be located in a plated via, the overall surface area of an assembly can be reduced.

In addition, because the majority of the solder joint (633) is located within a plated opening (629) of assembly 621, the distance between a substrate and (623) and interposer (627) can be reduced. Accordingly, an assembly having plated vias with vent openings can have a lower profile than assemblies (601) with filled vias (613). See FIG. 6 where $Y_2 < Y_1$.

Figure 7A:
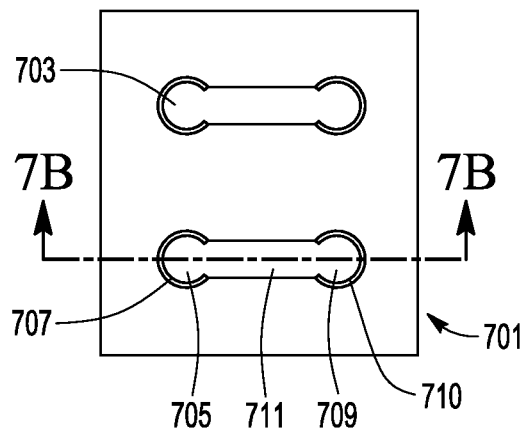
FIGS. 7A-7B show different views of a workpiece according to one embodiment of the present invention.
Figure 7B:
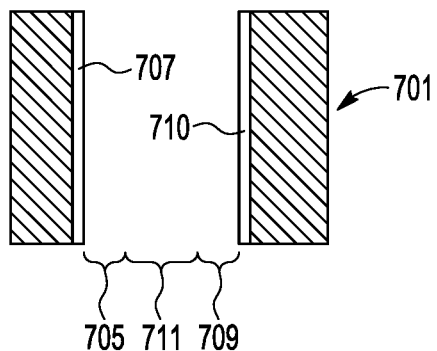

FIGS. 7A and 7B are a top and side cross sectional views, respectively, of workpiece 701 according to another embodiment of the present invention. In this embodiment, the vent openings are slots (711) that extend between two plated openings (705 and 709). Plated opening 705 includes a sidewall plating 707 and plated opening 709 includes a sidewall plating 710. FIG. 7B shows a cross sectional side view of interposer 701 showing the position of openings 705 and 709, sidewall platings 707 and 710, and slot 711. In one embodiment, the slots (711) can be made with a router, laser ablation, or by chemical etching.

Figure 7C:
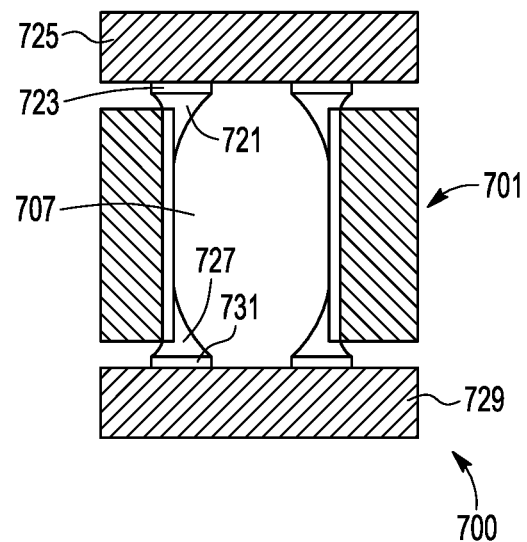
FIG. 7C shows a cross-sectional side view of an electronic component assembly according to one embodiment of the present invention.

FIG. 7C is a cross sectional side view of assembly 700 which includes interposer 701 and substrates 725 and 729 along the same cross sectional view of interposer 701 in FIG. 7B. Assembly 700 includes solder joints (721) for electrically coupling pads (723) of substrate 725 to sidewall platings (707) and solder joints (727) for electrically coupling pads (731) of substrate 729 to the sidewall platings (707).

Figure 8A:
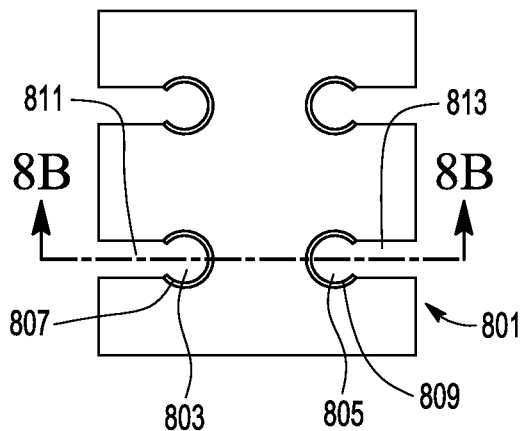
FIGS. 8A-8B show different views of a workpiece according to one embodiment of the present invention.
Figure 8B:
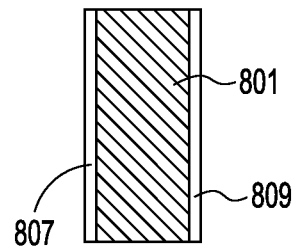
Figure 8C:
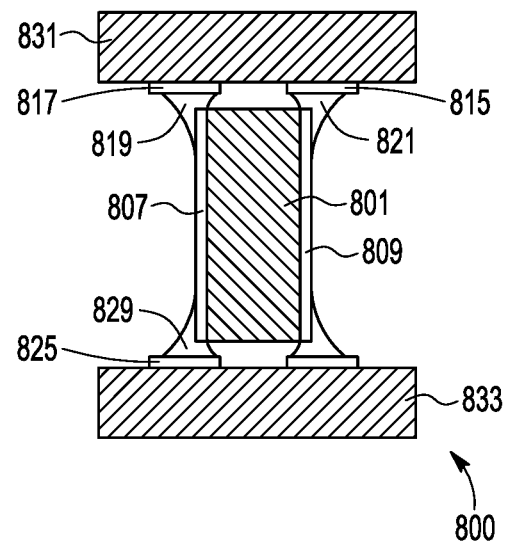
FIG. 8C shows a cross-sectional side view of an electronic component assembly according to one embodiment of the present invention.

FIGS. 8A and 8B are a top and side cross sectional views, respectively, of workpiece 801 according to another embodiment of the present invention. Workpiece 801 includes plated openings (803 and 805) with sidewall platings (807 and 809). The plated openings include vent holes 811 and 813 that extend out the lateral side of workpiece 801. FIG. 8C is a cross sectional side view of assembly 800 that includes workpiece 801 and substrates 831 and 833. Substrate 831 includes conductive pads 817 and 815 that are coupled with solder joints 819 and 821 to sidewall plating 807 and 809, respectively. Substrate 833 also includes pads (825) that are electrically coupled to sidewall platings (807) of workpiece 801 with joints (829).

In one embodiment, workpiece 801 was originally part of a larger workpiece that included multiples holes for each subsequently singulated workpiece (like workpiece 801). The vent hole slots (e.g. 811) were made to connect an opening 803 of workpiece 801 with an opening of an adjacent workpiece (not shown) prior to singulation. In another embodiment, vent holes 811 are formed from drilling from the lateral side of workpiece 801.

Figure 9:
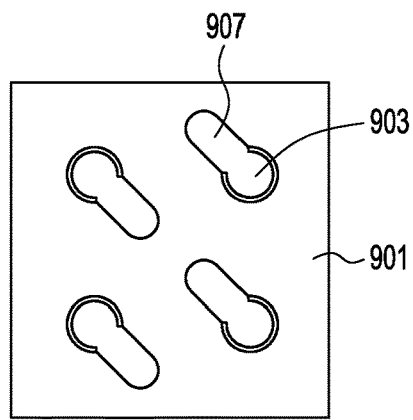
FIG. 9 is a top view of a workpiece according to one embodiment of the present invention.

FIG. 9 is a top view of another workpiece 901 that includes one vent hole (907) for each plated opening (903). In the embodiment of FIG. 9, the vent holes are positioned diagonally with respect to the lateral sides of the workpiece. One advantage to positioning the vent holes diagonally is that plated openings can be positioned closer together.

Figure 10:
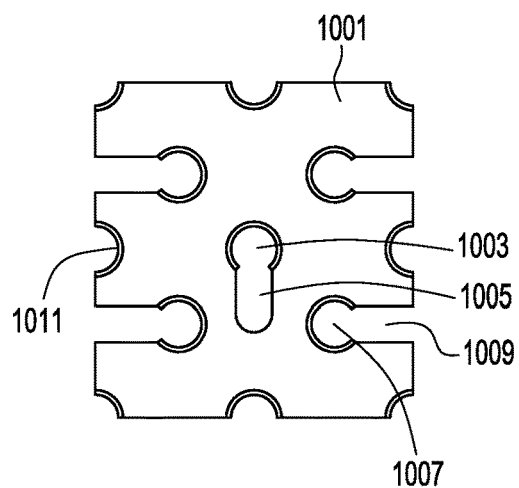
FIG. 10 is a top view of a workpiece according to one embodiment of the present invention.

FIG. 10 is a top view of another workpiece. Workpiece 1001 includes a plated opening 1003 with a slotted vent hole 1005 as well as plated openings (1007) with slot holes (1009) extending out the lateral sides of the workpiece 1001. Also workpiece 1001 includes sidewall platings (1011) that are located on the lateral edge of the workpiece.

In one embodiment, workpiece 1001 is formed from a larger workpiece (not shown) that is subsequently singulated into smaller workpieces such as workpiece 1001. The larger workpiece is cut along plated holes to form the sidewall platings (1011) located at the lateral edges of workpiece 1001.

Workpieces 801, 901, and 1001 each include a single vent hole per plated opening. One advantage of a single vent hole per plated opening is that it reduces the probability of the conductive joint material shorting to the other plated openings that share a vent hole. However, such and embodiment requires more vent holes to be formed as opposed to a workpiece where multiple plated openings are connected to one vent hole (e.g. workpiece 501). Also, although the figures show vent openings having a circular or slot form, other vent openings may have other forms (e.g. square, oval, irregular) in other embodiments.

Figure 11:
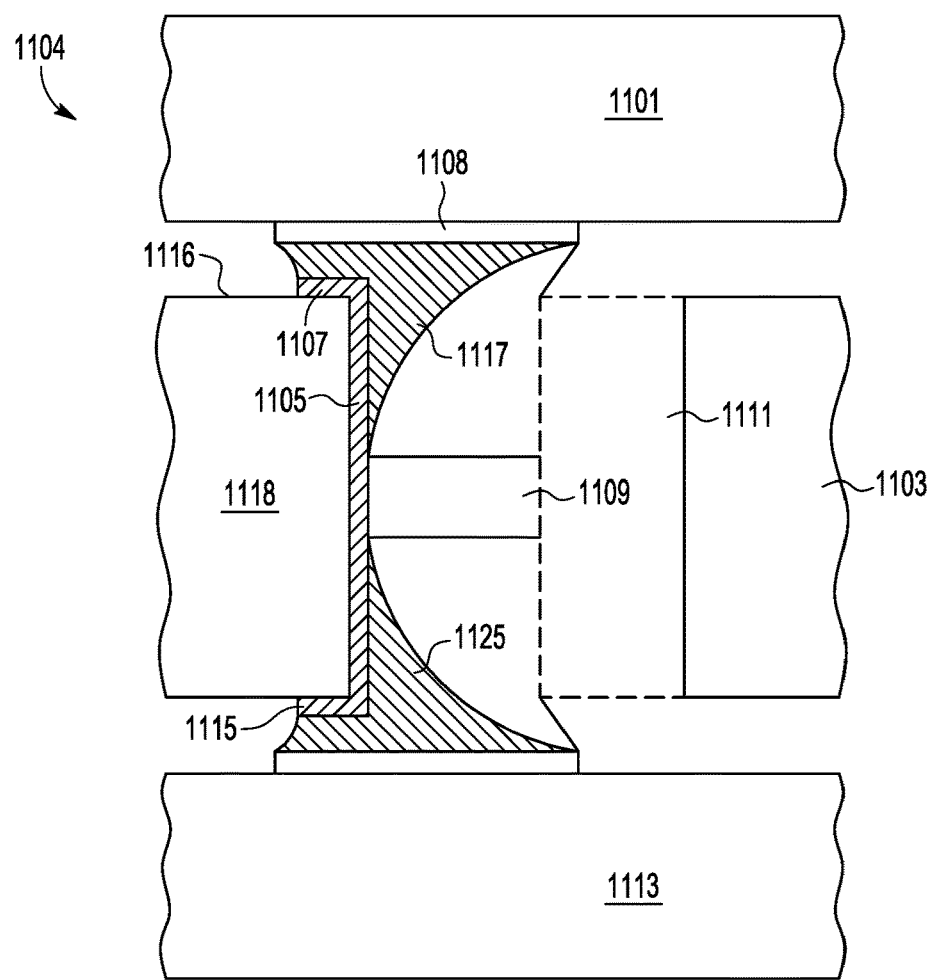
FIG. 11 is a partial cutaway side view of an electronic component assembly according to one embodiment of the present invention.

FIG. 11 is a partial cutaway side view of assembly 1100. Assembly 1100 includes packaged semiconductor device 1101, packaged semiconductor device 1103, and circuit board 1113. Packaged semiconductor device 1103 includes a die (not shown) embedded in encapsulant 1118. Opening 1109 includes a sidewall plating 1105 that has a top plate pad 1107 and a bottom plate pad 1115. Opening 1109 is formed by forming an opening through encapsulant 1118 of packaged device 1103. A vent opening 1111 is connected to plated opening 1109 to provide a path for outgassing during the reflow of the solder joints (1117). In one embodiment, pads 1107 and 1115 are formed by plating packaged device 1103 and then subsequently preventing those areas from being etched during the removal of the remaining plated material on the major surfaces of packaged device 1103. In one embodiment, parts of the plate pads for the plated openings are removed when forming the vent openings. Plate pads 1107 and 1115 are not considered to cover the sidewall of encapsulant 1118 of opening 1109 in a plane parallel to top surface 1116 of packaged device 1103.

Device 1101 has a pad 1108 electrically coupled to sidewall plating 1105 of opening 1109 with solder joint 1117 and board 1113 includes a pad 1124 electrically coupled to sidewall plating 1105 with solder joint 1125. As shown in FIG. 11, the solder joints 1117 and 1125 are also attached to top plate pad 1107 and bottom plate pad 1115 respectively.

Figure 12A:
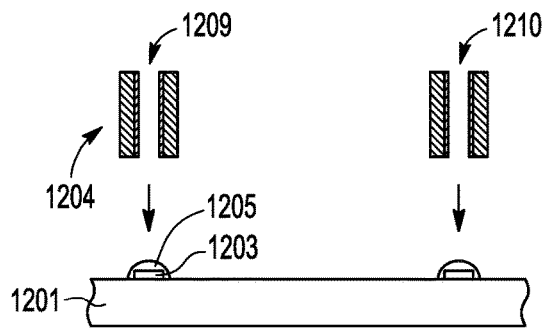
FIGS. 12A-12F are partial cross-sectional side views of various stages in forming a packaged electronic component according to one embodiment of the present invention.
Figure 12B:
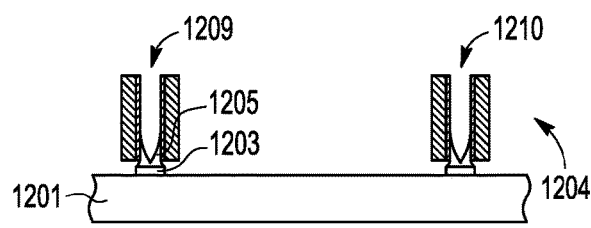

FIGS. 12A-12F are cross sectional views of various stages in the manufacture of a packaged integrated circuit. FIG. 12A is a cross sectional view of an interposer 1204 being brought to a substrate 1201 for attachment. Interposer 1204 includes plated through holes 1209 and 1210. In the embodiment shown, the two sections of interposer 1204 are connected at another cross section not shown in FIG. 12A. Also not shown in FIG. 12A are the vent openings for plated through holes 1209 and 1210 which are also located in another cross section of interposer 1204 not shown in FIG. 12A. Substrate 1201 includes conductive pads (1203) that have solder paste 1205 applied thereto. In one embodiment, substrate 1201 includes conductive structures (not shown) embedded therein and on the bottom major side of substrate 1201 (relative to the view shown in FIG. 12A). In FIG. 12B, interposer 1204 is brought to substrate 1201 and the assembly is subjected to reflow temperatures to reflow the solder paste (1205) to attach to the sidewall plating of the plated through holes. During the reflow process, solder does not attach to the sidewalls of the vent holes (not shown) in that those sidewalls do not contain solder wettable material.

Figure 12C:
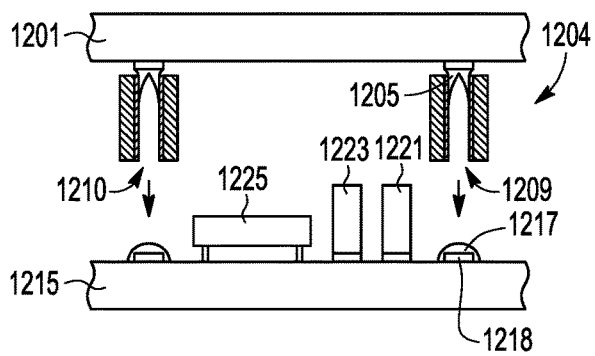

FIG. 12C shows a cutaway side view of the assembly after substrate 1201 and interposer 1204 are flipped over and are being brought to substrate 1215 for attachment. Bottom substrate 1215 includes conductive pads (1218) with applied solder paste (solder 1217). Also attached to substrate 1215 are electronic components 1225, 1223, and 1221. Substrate 1215 includes conductive structures (not shown) for electrically coupling the electronic components to each other and to conductive structures (not shown) on the bottom side of substrate 1215.

Figure 12D:
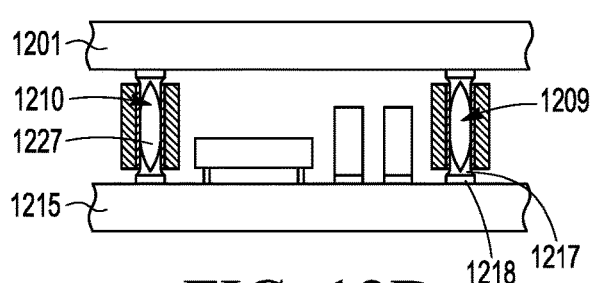

FIG. 12D shows the assembly after the plated openings (1209) are electrically coupled to the pads (1218) of substrate 1215. After interposer 1204 and substrate 1201 are brought to substrate 1215, the assembly is subject to reflow temperatures where the solder (1217) that was applied to pads (1218) of substrate 1215 is reflowed so that solder attaches to the sidewall platings of the plated through holes (1209). During the reflow process, the gasses built up in the plated through holes of interposer 1204 are release though the vent openings (not shown in the cross section of FIG. 12D).

In other embodiments, the substrates 1201 and 1215 and interposer 1204 may be stacked together and then reflowed at one time to form the solder joints. Providing the plated openings with vent openings may be advantages with this embodiment in that it allows for outgassing through the vent openings when both sides of a plated through hole are being electrically attached to conductive structures at the same time. Without the vent openings, the gases would be trapped in the plated through hole.

Figure 12E:
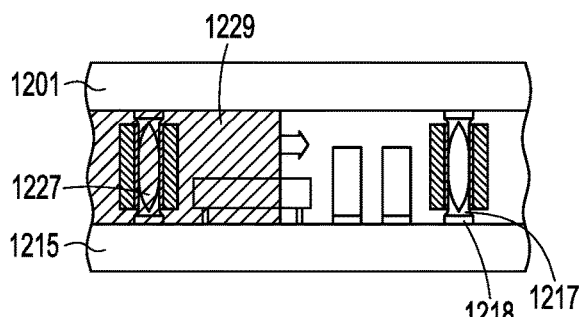

FIG. 12E shows a partial cross-sectional side view of the assembly as encapsulant 1229 is being applied to encapsulate the structures between substrate 1201 and substrate 1215. In the embodiment shown, the encapsulant process is a transfer molding process. During the encapsulation process, encapsulant 1229 fills the empty spaces (1227) of the plated through holes through the vent openings. In some embodiments this advantageously provides a mold interlocking feature to aid in securing the encapsulant to the interposer 1204.

Figure 12F:
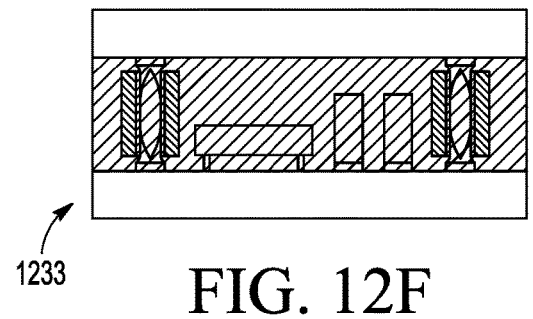

FIG. 12F shows a cross sectional view of a packaged electronic component. In one embodiment, after the encapsulation process, the assembly is singulated into individual packaged electronic components (1233). In other embodiments, other processes may be performed on the assembly prior to singulation such as e.g. attaching conductive terminals (e.g. solder balls) to the bottom substrate 1215 or attaching other packaged electronic components to substrate 1201.

Figure 13:
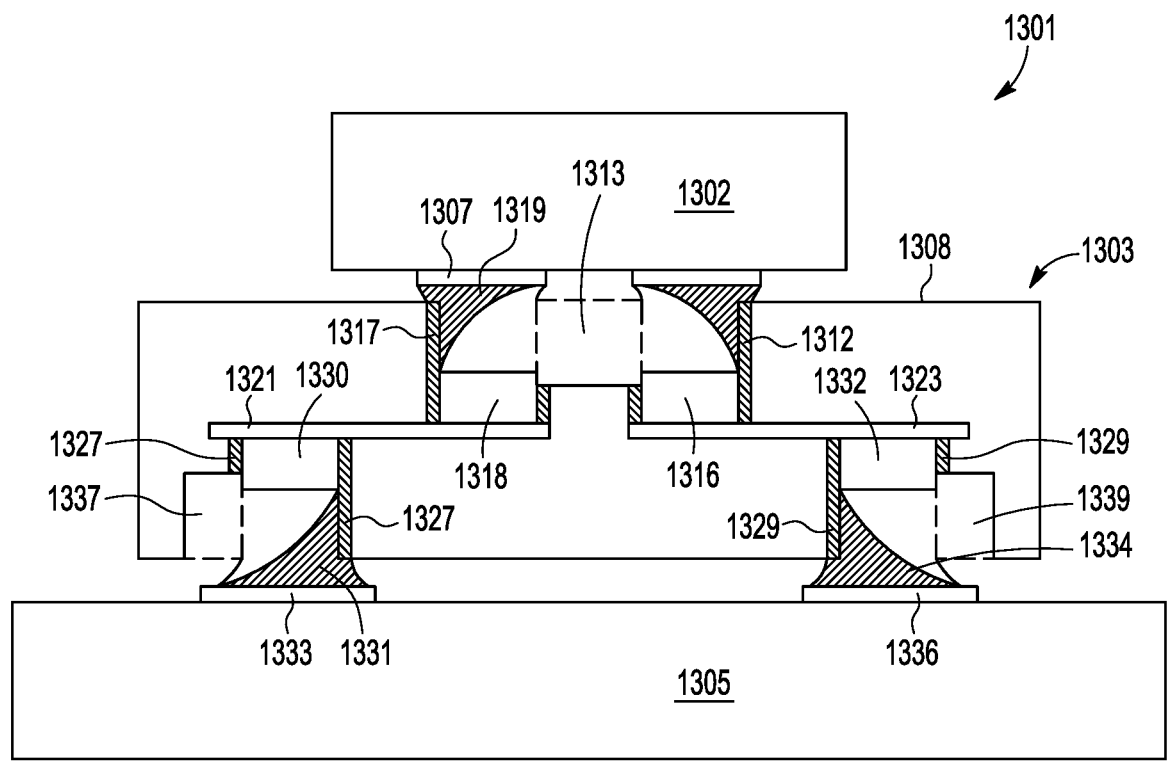
FIG. 13 is a cutaway side view of an electronic component assembly according to one embodiment of the present invention.

FIG. 13 shows a cutaway side view of an assembly 1301 according to another embodiment of the present invention. Assembly 1301 includes a packaged electronic component 1302 which in one embodiment is a microprocessor or standalone memory. In other embodiments, a substrate or printed circuit board may be located in the position of component 1302. Component 1302 is coupled to a system circuit board 1305 through an intermediate circuit board 1303. Circuit board 1303 includes an embedded conductive interconnect layer in dielectric material including conductive interconnects (1323) for redistributing signal lines from component 1302 to conductive structures (pad 1336) on circuit board 1305. In some embodiments, component 1302 is coupled to other electronic components (e.g. a standalone memory, not shown) located on board 1303 via the embedded conductive structures (e.g. interconnect 1323) of board 1303 and also conductive structures (not shown) on major surface 1308 of board 1303 In some embodiments, board 1303 is a package substrate where multiple electronic components (not shown) are attached to surface 1308 and in which the components (including packaged electronic component 1302) are encapsulated with an encapsulant (not shown).

In the embodiment shown, board 1303 includes plated openings 1318 and 1316 that extend from major surface 1308 to embedded interconnect structures (1323) of board 1303. These plated openings are characterized as blind vias in that they do not extend though the board as with plated through hole vias. Plated openings 1318 and 1316 include sidewall platings 1317 and 1312, respectively for conveying signals from component 1302 to the embedded interconnects (1323). Board 1303 includes vent opening 1313 that is connected to openings 1318 and 1316 and that provides an outgassing path for gasses generated during the reflow of solder for forming solder joints (1319) to couple the sidewall platings (1317 and 1312) to pads (1307) of component 1302. Opening 1313 has a sidewall of dielectric material. Opening 1313 and openings 1318 and 1316 form a larger opening. Solder of the solder joints (1319) do not attach to the sidewalls of vent opening 1313 in that the sidewall material of opening 1313 is not a solder wettable surface.

In the embodiment shown, vent opening 1313 does not extend as far into board 1303 as the openings 1318 and 1316. In some embodiments, the vent opening can extend the same depth as the plated openings and in others it can extend farther.

Board 1303 also includes plated openings 1330 and 1332 each having a sidewall plating 1327 and 1329, respectively, for coupling the embedded interconnects (1323) to conductive pads 1333 and 1336 of board 1305. Opening 1330 is connected to a vent opening 1327 and opening 1332 is connected to a vent opening 1339 in board 1303 for providing an outgassing path during a solder reflow operation during the formation of solder joints 1331 and 1334.

Although board 1303 is shown with one embedded interconnect layer, in other embodiments a board (substrate or interposer) may include multiple embedded interconnect layers for electrical redistribution. In some embodiments, the circuit board or substrate may be characterized as a cored circuit board or substrate. In other embodiments, the circuit board or substrate may be characterized as a coreless circuit board or substrate. In some embodiments a board, substrate, or interposer may include both plated blind vias and plated through hole vias.

Providing vent openings for blind vias provides for a vent path for outgassing which in some embodiments is important because a blind via is closed on one side.

Features described with respect to one embodiment in this application may be included in the other embodiments described herein. For example, any of the embodiments shown with plated through holes may include plated blind vias or vice versa.

In one embodiment, a method of forming a plated opening in a workpiece includes forming a first opening in a first major surface of workpiece. The forming the first opening includes removing non-conductive material of the workpiece to form a sidewall of the non-conductive material. The method includes plating the sidewall with a conductive material to form a sidewall plating. The method further includes after the plating, forming a vent opening. The forming the vent opening includes removing a portion of the non-conductive material at the sidewall. At least a first portion of the sidewall plating remains after the forming the vent opening. The forming the vent opening includes forming a second sidewall of the non-conductive material that is not covered by the sidewall plating.

In another embodiment, a method of electrically coupling to a workpiece includes bringing together a conductive structure and a workpiece wherein the workpiece includes an opening extending from a first major surface of the workpiece. The opening includes an opening in non-conductive material of the workpiece. The opening in the non-conductive material includes an opening sidewall of the non-conductive material. A sidewall plating covers a first portion of the opening sidewall in a plane that is parallel to the first major surface. A second portion of the opening sidewall in the plane is not covered by the sidewall plating. The method includes electrically coupling the conductive structure to the sidewall plating with a conductive joint material structure wherein at least a portion of the conductive joint material structure is located in the opening of the non-conductive material including in the plane after the electrically coupling. After the electrical coupling, a portion of the opening of the non-conductive material in the plane is free of conductive joint material of the conductive joint material structure.

In another embodiment, an electronic component assembly includes an electronic component and a workpiece including an opening extending from a first major surface of the workpiece. The opening including an opening sidewall of non-conductive material. The assembly includes a sidewall plating. The sidewall plating covers a first portion of the opening sidewall of the non-conductive material in a plane parallel to the first major surface. A second portion of the opening sidewall in the plane is not covered by the sidewall plating. The assembly includes a conductive structure electrically coupled to the sidewall plating with a conductive joint material structure attached to the sidewall plating and to the conductive structure. At least a portion of the conductive joint material structure is located in the opening and attached to the sidewall plating in the opening including in the plane. The conductive joint material structure is not attached to the second portion of the opening sidewall in the plane.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An electronic component assembly comprising:
   an electronic component;
   a workpiece including an opening extending from a first major surface of the workpiece, the opening including an opening sidewall of non-conductive material;
   a sidewall plating, the sidewall plating covers a first portion of the opening sidewall of the non-conductive material in a plane parallel to the first major surface, a second portion of the opening sidewall in the plane is not covered by the sidewall plating;
   a conductive structure electrically coupled to the sidewall plating with a conductive joint material structure attached to the sidewall plating and to the conductive structure, wherein at least a portion of the conductive joint material structure is located in the opening and attached to the sidewall plating in the opening including in the plane, wherein the conductive joint material structure is not attached to the second portion of the opening sidewall in the plane.

2. The assembly of claim 1 wherein the sidewall plating extends to a conductive structure embedded in the workpiece and the sidewall plating and a portion of the opening are characterized as a plated blind via.

3. The assembly of claim 2 wherein a second sidewall plating covers a third portion of the opening sidewall in the plane, the assembly further includes a second conductive structure electrically coupled to the second sidewall plating with a second conductive joint material structure attached to the second sidewall plating and to the second conductive structure, wherein at least a portion of the second conductive joint material structure is located in the opening and attached to the second sidewall plating in the opening, wherein the second conductive joint material structure is not attached to the second portion of the opening sidewall in the plane and is not attached to the sidewall plating.

4. The assembly of claim 1 wherein the sidewall plating and the opening extends to a second major surface of the workpiece opposite the first major surface and a portion of the opening and the sidewall plating are characterized as a plated through hole via.

5. The assembly of claim 4 wherein a second sidewall plating covers a third portion of the opening sidewall in the plane, the assembly further includes a second conductive structure electrically coupled to the second sidewall plating with a second conductive joint material structure attached to the second sidewall plating and to the second conductive structure, wherein at least a portion of the second conductive joint material structure is located in the opening and attached to the second sidewall plating in the opening, wherein the second conductive joint material structure is not attached to the second portion of the opening sidewall in the plane and is not attached to the sidewall plating.

6. The assembly of claim 1 wherein the workpiece is characterized as an interposer and the conductive structure is a conductive structure of a substrate, wherein the interposer is encapsulated in an encapsulant with the electronic component.

7. The assembly of claim 1 wherein the second portion of the opening sidewall in the plane is covered by an encapsulant.

8. The assembly of claim 1 wherein a second sidewall plating covers a third portion of the opening sidewall in the plane, the assembly further includes a second conductive structure electrically coupled to the second sidewall plating with a second conductive joint material structure attached to the second sidewall plating and to the second conductive structure, wherein at least a portion of the second conductive joint material structure is located in the opening and attached to the second sidewall plating in the opening, wherein the second conductive joint material structure is not attached to the second portion of the opening sidewall in the plane and is not attached to the sidewall plating.

9. The assembly of claim 1 wherein a second sidewall plating covers a third portion of the opening sidewall in the plane, the assembly further includes a second conductive structure electrically coupled to the second sidewall plating with a second conductive joint material structure attached to the second sidewall plating and to the second conductive structure, wherein at least a portion of the second conductive joint material structure is located in the opening and attached to the second sidewall plating in the opening, wherein the second conductive joint material structure is not attached to the second portion of the opening sidewall in the plane and is not attached to the sidewall plating.

* * * * *